United States Patent
Chen

(10) Patent No.: US 10,045,343 B2
(45) Date of Patent: Aug. 7, 2018

(54) DIGITAL AUTO FREQUENCY CONTROL FOR A GENERAL PURPOSE IF SUBSYSTEM WITH MULTI-MODULATION SCHEMES

(71) Applicant: Agency for Science, Technology and Research, Singapore (SG)

(72) Inventor: Xi Chen, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 247 days.

(21) Appl. No.: 14/767,542

(22) PCT Filed: Feb. 24, 2014

(86) PCT No.: PCT/SG2014/000079
§ 371 (c)(1),
(2) Date: Aug. 12, 2015

(87) PCT Pub. No.: WO2014/129978
PCT Pub. Date: Aug. 28, 2014

(65) Prior Publication Data
US 2016/0021662 A1    Jan. 21, 2016

(30) Foreign Application Priority Data
Feb. 22, 2013 (SG) .............................. 201301351-1

(51) Int. Cl.
*H04W 72/04* (2009.01)
*H04L 27/22* (2006.01)
(Continued)

(52) U.S. Cl.
CPC .......... *H04W 72/0453* (2013.01); *H03J 7/04* (2013.01); *H04B 17/318* (2015.01);
(Continued)

(58) Field of Classification Search
CPC .......... H04W 72/0453; H04L 27/2657; H04L 27/0014; H04L 27/22; H04L 2027/0073;
(Continued)

(56) References Cited

U.S. PATENT DOCUMENTS 5,678,223 A * 10/1997 Callaway, Jr. ............ H03J 7/02
455/182.1
5,809,009 A * 9/1998 Matsuoka ................. H03J 7/02
370/206
(Continued)

FOREIGN PATENT DOCUMENTS

WO    WO-2014/129978    8/2014

OTHER PUBLICATIONS

"International Application No. PCT/SG2014/000017, International Preliminary Report on Patentability dated Jul. 30, 2015", 9 pgs.
(Continued)

*Primary Examiner* — Andrew Lai
*Assistant Examiner* — Harry H Kim
(74) *Attorney, Agent, or Firm* — Schwegman Lundberg & Wossner, P.A.

(57) ABSTRACT

An automatic frequency control (AFC) device is provided. The AFC device includes an input module, a received signal strength indicator (RSSI) module and a carrier frequency offset (CFO) estimation module. The input module down converts and samples a received signal. The RSSI module is coupled to the input module and calculates a RSSI signal in response to the down converted and sampled received signal. The CFO estimation module is coupled to the input module and the RSSI module and calculates a moving average of binary elements of the down converted and sampled received signal. The CFO estimation module continues to calculate the moving average until the AFC converges.

5 Claims, 6 Drawing Sheets

(51) Int. Cl.
*H04L 27/00* (2006.01)
*H03J 7/04* (2006.01)
*H04B 17/318* (2015.01)
*H04L 27/26* (2006.01)

(52) U.S. Cl.
CPC .......... *H04L 27/0014* (2013.01); *H04L 27/22* (2013.01); *H04L 27/2657* (2013.01); *H04L 2027/0028* (2013.01); *H04L 2027/0055* (2013.01); *H04L 2027/0065* (2013.01); *H04L 2027/0069* (2013.01); *H04L 2027/0073* (2013.01)

(58) Field of Classification Search
CPC ..... H04L 2027/0065; H04L 2027/0055; H04L 2027/0028; H04L 2027/0069; H04B 17/318; H03J 7/04
See application file for complete search history.

(56) References Cited

U.S. PATENT DOCUMENTS

| | | |
|---|---|---|
| 6,606,487 B2 | 8/2003 | Sternberg |
| 7,593,692 B2 | 9/2009 | Hansen et al. |
| 2003/0067963 A1* | 4/2003 | Miller .................. H04B 1/7183 375/130 |
| 2010/0117993 A1* | 5/2010 | Kent .................... G06F 3/0418 345/177 |
| 2010/0239051 A1 | 9/2010 | Kathiresan |

OTHER PUBLICATIONS

"International Application No. PCT/SG2014/000079, Written Opinion dated Apr. 3, 2014", 7 pgs.

"International Application No. PCT/SG2014/000079, International Search Report dated May 16, 2014", (May 16, 2014), 6 pgs.

* cited by examiner

DIGITAL AUTO FREQUENCY CONTROL FOR A GENERAL PURPOSE IF SUBSYSTEM WITH MULTI-MODULATION SCHEMES

PRIORITY CLAIM

This application is a U.S. national stage application filed under 35 U.S.C. § 371 from International Application Serial No. PCT/SG2014/000079, which was filed 24 Feb. 2014, and published as WO2014/129978 on 28 Aug. 2014, and which claims priority to Singapore Patent Application No. 201301351-1, filed 22 Feb. 2013, which applications and publication are incorporated by reference as if reproduced herein and made a part hereof in their entirety, and the benefit of priority of each of which is claimed herein.

FIELD OF THE INVENTION

The present invention generally relates to digital automatic frequency calibration (AFC) circuits, and more particularly relates to a digital AFC circuit for use in a general purpose intermediate frequency (IF) subsystem with multi-modulation schemes.

BACKGROUND

Many wireless channel digital frequency and phase modulation systems such as frequency shift keying (FSK), Gaussian frequency shift keying (GFSK), and minimum phase shift keying (MSK) are sensitive to carrier frequency offset (CFO) caused by transceiver oscillator instability and/or Doppler shift. This is especially true when data is transmitted in a burst mode. One possible solution applies an auto-frequency calibration (AFC) block in the receiver to automatically estimate and compensate for such frequency offset. However, compared with the multiplicity of conventional designs for FSK/GFSK/MSK transceivers, CFO estimation and compensation circuits for such systems are rare.

Conventional CFO estimation and/or compensation schemes have many drawbacks. An early conventional scheme utilized a set of analog AFC tracking algorithms and can be recognized as the basis of the modern digital AFC. Some conventional digital schemes utilized a set of digital closed-loop decision-aided AFC tracking algorithms for GFSK systems. However, both of these algorithms require reconstruction of transmitted data symbols and submission of these data symbols to the CFO estimator as reference information. Therefore, the trackable AFC range of these conventional schemes is limited so as to not exceed the maximum frequency divination and, thus, accurate sample timing recovery is required. Another typical scheme utilizes an open-loop AFC tracking algorithm which directly estimates the DC offset of the discriminator output. However, application of this AFC algorithm is limited to frequency modulation systems with discriminator demodulators. A direct CFO estimator based on received signals and remodulated transmitted symbols has also been proposed, but the channel response and the training sequence must be known in advance. Further, some conventional AFC algorithms are based on Fast Fourier Transforms (FFT) and Maximum Likelihood which have disadvantageous high computational requirements.

Additionally, many of the existing AFC algorithms assume that the received signal has a constant envelope. However, this assumption is not always true, especially when the Inter-Channel Interference (ICI) and Automatic Gain Control (AGC) uncertainties are taken into account. A further normalization method for AFC in GFSK systems normalizes the estimated CFO to the maximum deviation, ignoring gains along the receiving path.

Thus, what is needed is an easy to implement automatic frequency calibration scheme which does not require timing recovery and/or source data recovery while also taking into account the ICI and AGC uncertainties. Furthermore, other desirable features and characteristics will become apparent from the subsequent detailed description and the appended claims, taken in conjunction with the accompanying drawings and this background of the disclosure.

SUMMARY

According to the Detailed Description, an automatic frequency control (AFC) device is provided. The AFC device includes an input module, a received signal strength indicator (RSSI) module, and a carrier frequency offset (CFO) estimation module. The input module down converts and samples a received signal. The RSSI module is coupled to the input module and calculates a RSSI signal in response to the down converted and sampled received signal. The CFO estimation module is coupled to the input module and the RSSI module and calculates a moving average of binary elements of the down converted and sampled received signal when the RSSI signal exceeds a predetermined threshold. The CFO estimation module continues to calculate the moving average until the AFC converges.

In accordance with another aspect, a method for automatic frequency control (AFC) is provided. The method includes monitoring a received strength signal indicator (RSSI) signal and calculating a moving average of binary elements of the received signal when the RSSI signal exceeds a predetermined threshold. The method further includes continuing the step of calculating the moving average until the AFC converges.

BRIEF DESCRIPTION OF THE DRAWINGS

The accompanying figures, where like reference numerals refer to identical or functionally similar elements throughout the separate views and which together with the detailed description below are incorporated in and form part of the specification, serve to illustrate various embodiments and to explain various principles and advantages in accordance with a present embodiment.

Skilled artisans will appreciate that elements in the figures are illustrated for simplicity and clarity and have not necessarily been depicted to scale. For example, the dimensions of some of the elements in the block diagrams or flowcharts may be exaggerated in respect to other elements to help to improve understanding of the present embodiments.

DETAILED DESCRIPTION

The following detailed description is merely exemplary in nature and is not intended to limit the invention or the application and uses of the invention. Furthermore, there is no intention to be bound by any theory presented in the preceding background of the invention or the following detailed description. It is the intent of the present embodiment to present a novel non-decision-aided digital closed loop automatic frequency control (AFC) tracking algorithm based on the moving average of the digital discriminator's output. This AFC does not require timing recovery and/or source data recovery. While existing decision-aided AFC methods usually require received data to be demodulated even before CFO is compensated thereby limiting the tracking range to below the maximum frequency deviation, the AFC in accordance with the present embodiment does not have such a requirement and thus has a wider tracking range. An adaptive tracking loop gain scheme is also proposed to achieve a faster and more accurate tracking. The scheme automatically switches between fast and accurate modes by adjusting the loop gain according to the estimated CFO for each iteration. Lastly, Inter-Channel Interference (ICI) and Automatic Gain Control (AGC) uncertainties are also taken into consideration by normalizing the in-phase (I) and quadrature (Q) samples by re-using the existing digital RSSI. Meanwhile, the normalization is based on a simple bit shift and truncation process which makes it easy to implement.

Figure 1:
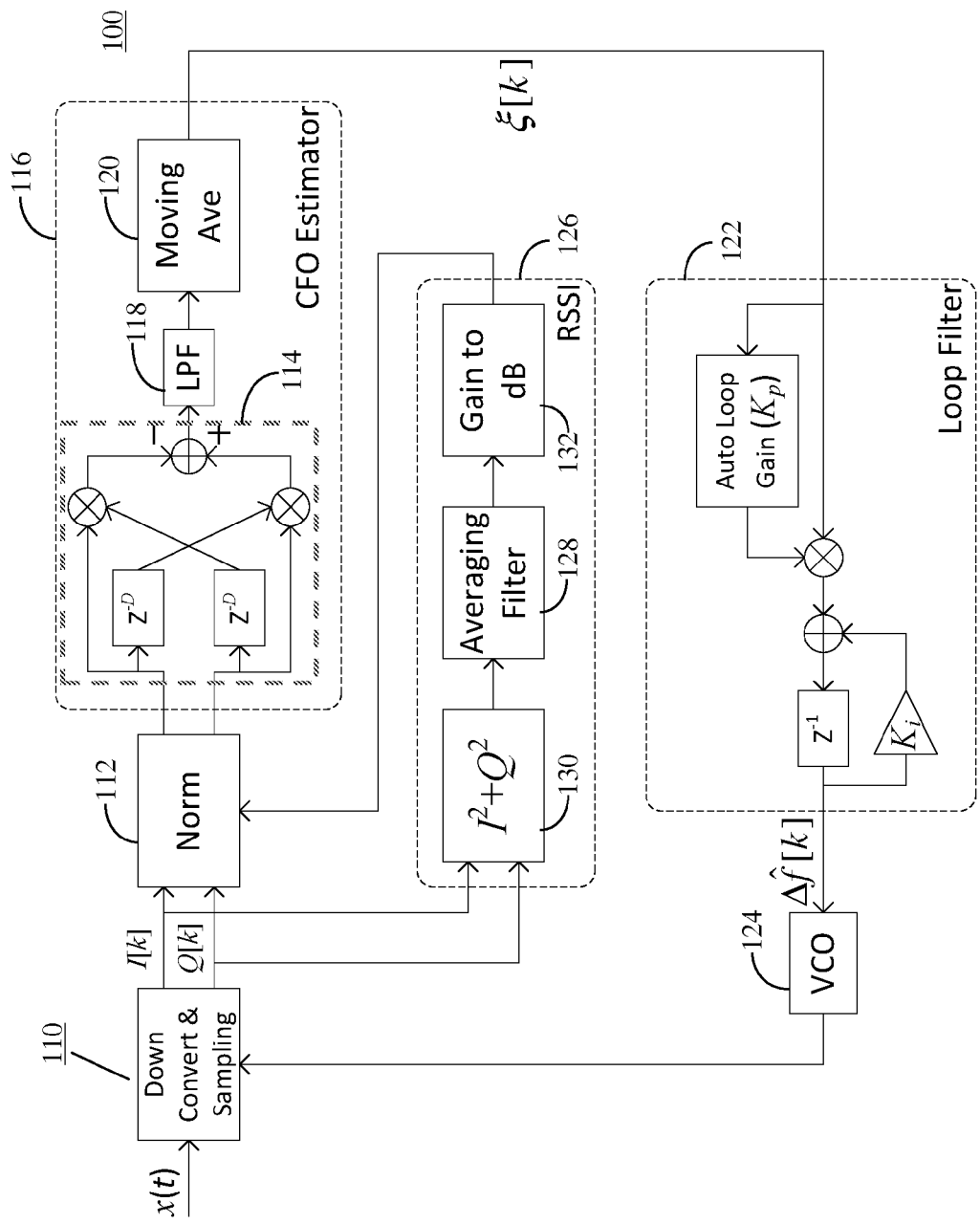
FIG. 1 depicts a block diagram of an intermediate frequency (IF) subsystem utilizing an automatic frequency calibration (AFC) circuit in accordance with a present embodiment.

Referring to FIG. 1, a block diagram 100 of a continuous-phase frequency shift keying (CPFSK) modulation device in accordance with a present embodiment is depicted. While the block diagram 100 and the discussion of the AFC algorithm in accordance with the present embodiment is limited to a CPFSK modulation device, the present embodiment and its AFC algorithm is applicable to any frequency modulation scheme including FSK, GFSK, and MSK. It will also be clear to those skilled in the art that the present embodiment based on a general CPFSK system can be easily applied to other phase modulation schemes.

Assume the received CPFSK signal is not distorted by channel and pre-detection filter, it can be denoted as $$x(t) = \sqrt{\frac{2E_b}{T_b}} \cos(2\pi f_c t + \theta(t) + \theta_0) + n(t) \quad (1)$$

where fc is the carrier frequency, n(t) is an additive bandpass Gaussian noise with one-sided power spectrum density $N_0$, $E_b$ and $T_b$ are the bit energy and bit period respectively. It should be noted that $E_b$ is the bit energy with the effects of AGC and with ICI removed by low-pass filter. It varies with different AGC or different ICI. $\theta_0$ is the initial phase offset and $\theta(t)$ is the frequency modulated phase as shown below $$\theta(t) \triangleq 2\pi h \int_{-\infty}^{\infty} \Sigma_{n=-\infty}^{\infty} x[n] g(\tau - nT) d\tau \quad (2)$$

where g(t) is the pulse shaping function for binary data, and h is the modulation index.

The block diagram 100 presents a device for closed-loop recursive automatic frequency calibration (AFC) algorithm for CFO estimation/compensation. The received waveform is received by an input module 110 which down converts the signal x(t) (Equation 1) to produce baseband in-phase (I) and quadrature (Q) signals. Ignoring the noise, the signals can be expressed as $$I(t) = \sqrt{\frac{E_b}{2T_b}} \cos(2\pi \Delta f t + \theta(t) + \theta_0) \quad (3)$$

$$Q(t) = \sqrt{\frac{E_b}{2T_b}} \sin(2\pi \Delta f t + \theta(t) + \theta_0) \quad (4)$$

where $\Delta f = f_c - f_c'$ is the frequency offset, and $f_c'$ is the frequency generated by the local oscillator.

The input module 110 then samples the I(t) and Q(t) signals at a sampling rate $1/T_s$ and then normalized by a normalization module 112. The normalized samples are then passed to a digital discriminator 114 of a carrier frequency offset (CFO) module 116. The delay taps of the digital discriminator 114 are set to D and the discriminated signal is filtered by a low pass filter (LPF) 118. Thereafter, a moving average block 120 with window size $L_w$ generates an indication of the difference between the transceiver's carrier frequency offset Δf. Lastly, the error signal is filtered by a loop filter module 122 to smooth out the noise and is used to steer a phase lock loop (PLL) to generate a frequency of a local oscillator 124 towards $f_c$.

From FIG. 1, it can be imagined that the error signal is proportional to the gains along the receiving path including AGC adjustment and low-pass filter for removing ICI. It is necessary to remove or suppress such correlation by normalization. A received signal strength indication module 126 provides a RSSI signal to the normalization module 112 for normalization by reusing the digital RSSI signal.

The over-sampled version of the complex baseband signals given by Equations 3 and 4 can be written as $$I[k] = I(kT_x) = \sqrt{\frac{E_b}{2T_b}} \cos(2\pi \Delta f k T_x + \theta(kT_x) + \theta_0) \quad (5)$$

$$Q[k] = Q(kT_x) = \sqrt{\frac{E_b}{2T_b}} \sin(2\pi \Delta f k T_x + \theta(kT_x) + \theta_0) \quad (6)$$

These I Q samples are passed to the discriminator 114 for further operation. However, the discriminator 114 output is proportional to the overall gains along the receiving path. Thus, the estimated CFO signal output from the CFO module 116 necessarily includes a constant ambiguity which needs to be removed. In accordance with the present embodiment, the normalization module 112 directly normalizes the I Q samples before they are fed to the discriminator 114. This advantageously narrows the required dynamic range of the digital discriminator 114 and achieves a stable tracking speed. In addition, reusing of the RSSI signal from the RSSI module 126 saves power consumption and chip area. In the digital RSSI module 126, the signal power is estimated by a filter 128 filtering an average value of the powers of I Q samples calculated by block 130, i.e., $$P = \Sigma_{k=0}^{L_R-1} I^2[k] + Q^2[k] \quad (7)$$

where $L_R$ is the length of the observation window of the RSSI. The estimated signal power is mapped to dB with resolution of 1 dB at a gain to dB block 132 and fed to the normalization module 112 to normalize the I Q samples. The normalization module 112 performs a dividing operation by truncating and shifting the fixed point samples. As each integer value of RSSI corresponds to a number of bits and direction of I Q samples (fixed-point numbers) that are to be shifted and the shifted numbers are truncated in accordance with the normalization requirements, the normalization module 112 shift and truncation process is easily implemented. Furthermore, the I Q samples are normalized within a certain range so that the AFC will never loose convergence, given other necessary conditions are satisfied.

Figure 2:
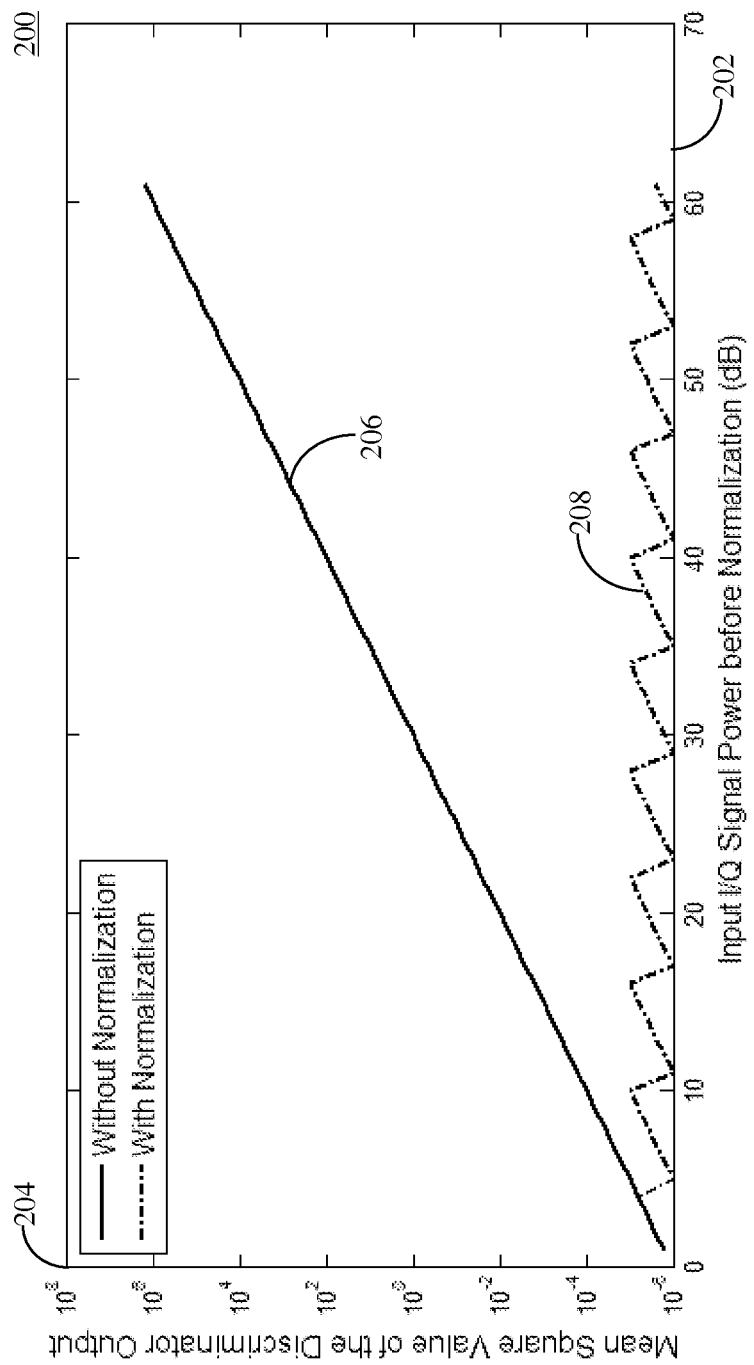
FIG. 2 depicts a graph of discriminator output of normalized I and Q channel samples comparing discriminator output with a normalized input in accordance with the present embodiment to discriminator output with a non-normalized input.

Referring to FIG. 2, a graph 200 illustrates the output of the digital discriminator 114 when the input I Q samples are normalized in accordance with the normalization scheme of the present embodiment. The I Q sample signal power is plotted along the x-axis 202 and the mean square value of the output of the discriminator 114 is plotted along the y-axis 204. The power of the input signal spans from 0 to 60 dB (normalized to Vpp=1V). Without normalization (trace 206) the discriminator output increases as the I Q signal power increases. However, after normalization, it is clear that the discriminator 114 output is limited in a reasonable range as seen in the bounded saw-blade pattern of trace 208.

The digital discriminator 114 outputs are the normalized I Q samples. Substituting this output into Equation 2 can be expressed as $$\xi[k] \triangleq I[k-D]Q[k] - I[k]Q[k-D] \quad (8)$$
$$= \sin\{2\pi\Delta f DT_s + [\theta(kT_s) - \theta(kT_s - DT_s)]\}$$
$$= \sin\left\{2\pi\Delta f DT_s + 2\pi h \int_{(k-D)T_s}^{kT_s} \sum_{n=-\infty}^{\infty} x[n]g(\tau-nT)d\tau\right\}$$
$$= \sin\{2\pi[\Delta f DT_s + h\varnothing(kT_s)]\}$$

where $\varnothing(kT_s)$ is defined by $$\varnothing(kT_s) \triangleq \int_{(k-D)T_s}^{kT_s} \sum_{n=-\infty}^{\infty} x[n]g(\tau-nT)d\tau \quad (9)$$

For the average of the above discriminator 114 output $\xi[k]$ with an observation window size being $L_w$ samples, if the preamble satisfies the condition of (0,1) balance in the observation window, then the average output can be expressed as $$\bar{\xi} \triangleq \frac{1}{L_w} \sum_{k=l}^{L_w+l-1} I[k-D]Q[k] - I[k]Q[k-D] \quad (10)$$
$$= \frac{1}{L_w} \sum_{k=l}^{L_w+l-1} \sin\{2\pi[\Delta f DT_s + h\varnothing(kT_s)]\}$$
$$= \frac{1}{L_w}\left\{\sin(2\pi\Delta f DT_s) \sum_{k=l}^{L_w+l-1} \cos[2\pi h\varnothing(kT_s)] + \cos(2\pi\Delta f DT_s) \sum_{k=l}^{L_w+l-1} \sin[2\pi h\varnothing(kT_s)]\right\}$$

Under the condition of the preamble being (0,1) balanced, it can be proven that the first summation term of Equation 10 in the big bracket can be approximated by a positive constant, and the second summation term approximately equals zero, that is $$\sum_{k=l}^{L_w+l-1} \cos[2\pi h\varnothing(kT_s)] \approx \alpha \quad (11)$$

$$\sum_{k=l}^{L_w+l-1} \sin[2\pi h\varnothing(kT_s)] \approx 0 \quad (12)$$

Therefore in view of the above and taking the AWGN noise into consideration, the moving average calculated at the block 120 and in Equation 10 can be rewritten as $$\bar{\xi} \approx \frac{\alpha}{L_w}\sin(2\pi\Delta f DT_s) + w(n) = 2\pi\beta\Delta f DT_s + w'(n) \quad (13)$$

where w(n) refers to the effect of AWGN noise, and w'(n) is the overall noise including the approximation error. Thus, the frequency offset output from the CFO module 116 can be estimated by $$\Delta \hat{f} = \frac{2}{2\pi\beta DT_s}\bar{\xi} \quad (14)$$

The approximation in Equation 13 holds only when $2\pi\Delta f DT_s$ is small. But when the feed-back tracking loop of the module 122 is employed, the condition for the loop to converge is that $\sin(2\pi\Delta f DT_s)$ has the same sign as $\Delta f$ to prevent the estimation of CFO being tracked to a wrong direction. Therefore, the condition of convergence is $|2\pi\Delta f DT_s|<\pi$, that is $$-\frac{1}{2DT_s} < \Delta f < \frac{1}{2DT_s} \quad (15)$$

The structure of the tracking loop filter 122 with adaptive gain is based on a standard feedback loop except that the loop gain in the loop filter 122 is adaptive to achieve fast tracking speed as well as accuracy. Since the parameter β in Equation 14 would be affected by factors such as sample timing error, a closed-loop recursive method is implemented to avoid this problem. The overall gain $1/(2\pi\beta DT_s)$ is absorbed into the loop gain $K_p$ and it should be noted that $K_p$ has a certain range of tolerance for tracking convergence. Hence the tracking speed and accuracy is not very sensitive to the error of the parameter β.

The loop filter 122 has two working modes, a Fast Mode and an Accurate Mode. It automatically switches between these two modes according to the absolute value of the moving average $\bar{\xi}[k]$ for each iteration as shown in FIG. 1. A positive threshold ζ is preset. The tracking loop is switched to Fast Mode or Accurate Mode if $|\bar{\xi}[k]|$ is detected above or below ζ, respectively. The mode switching is achieved by selecting High or Low values of the loop gain $K_p$. It is set to a high value $K_h$ in the Fast Mode, and set to a low value $K_l$ in the Accurate Mode, where $K_h$ and $K_l$ are preset for each system.

Figure 3:
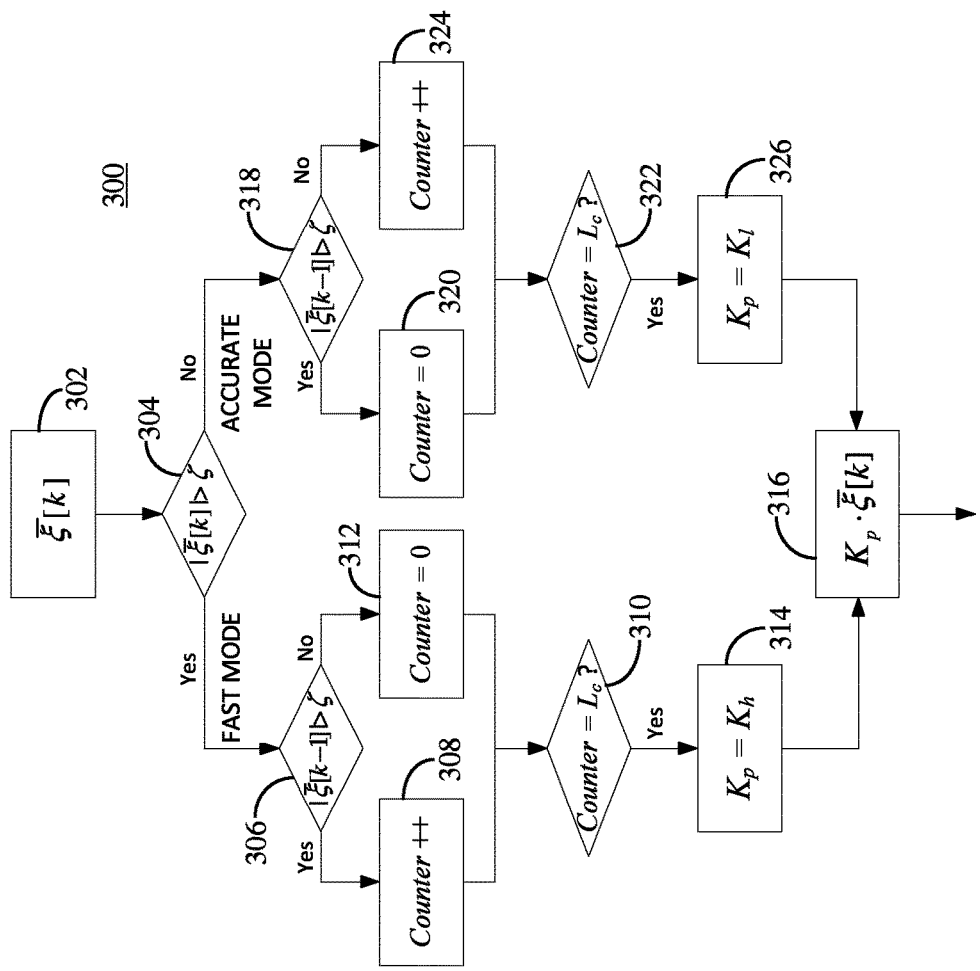
FIG. 3 depicts a flowchart of the operation of the normalization scheme of the AFC circuit depicted in FIG. 1 in accordance with the present embodiment.

In noisy cases, it is possible that $\bar{\xi}[k]$ jumps between above ζ and below ζ, respectively, for some consecutive iterations. To avoid such gain oscillation, the mode switching can be limited to happen only when $\bar{\xi}[k]$ is stabilized after switching from one side of the threshold to another. FIG. 3 depicts a flowchart 300 illustrating the logic of this gain control. At step 302, $\bar{\xi}[k]$ is received and at step 304 it is detected whether $|\bar{\xi}[k]|$ is above or below ζ. When $|\bar{\xi}[k]|$ is above ζ 304, the logic operates in the Fast Mode and it is decided 306 whether the previous $\bar{\xi}[k]$ (i.e., $|\bar{\xi}[k]-1|$) is greater than ζ, i.e., whether the operating mode is already in the Fast Mode. If operation is already in the Fast Mode 306, the counter is incremented 308 and it is determined 310 whether the number of samples is equal to the observation window size, that is whether the counter equals $L_c$. If operation is not in the Fast Mode 306, the counter is initialized to zero 312 and it is determined 310 whether the counter equals $L_c$. When the counter equals $L_c$ 310, the number of samples is equal to the observation window size and the loop gain $K_p$ is set equal to the high value $K_h$ 314 in the Fast Mode and the signal is filtered by multiplying ξ[k] by $K_p$ 316.

Alternatively, when |ξ[k]| is below ζ 304, the logic operates in the Accurate Mode and it is decided 318 whether the previous ξ[k] (i.e., |ξ[k]−1|) is higher than ζ, i.e., whether the operating mode is in the Fast Mode. If operation is in the Fast Mode 318, the counter is initialized to zero 320 and it is determined 322 whether the counter equals $L_c$. If operation is already in the Accurate Mode 318, the counter is incremented 324 and it is determined 322 whether the number of samples is equal to the observation window size, that is whether the counter equals $L_c$. When the counter equals $L_c$ 322, the number of samples is equal to the observation window size and the loop gain $K_p$ in the Accurate Mode is set equal to the low value $K_l$ 326 and the signal is filtered by multiplying ξ[k] by $K_p$ 316.

The following Table 1 shows the comparison of the main features of the AFC circuit of FIG. 1 and conventional AFC implementations.

Figure 4:
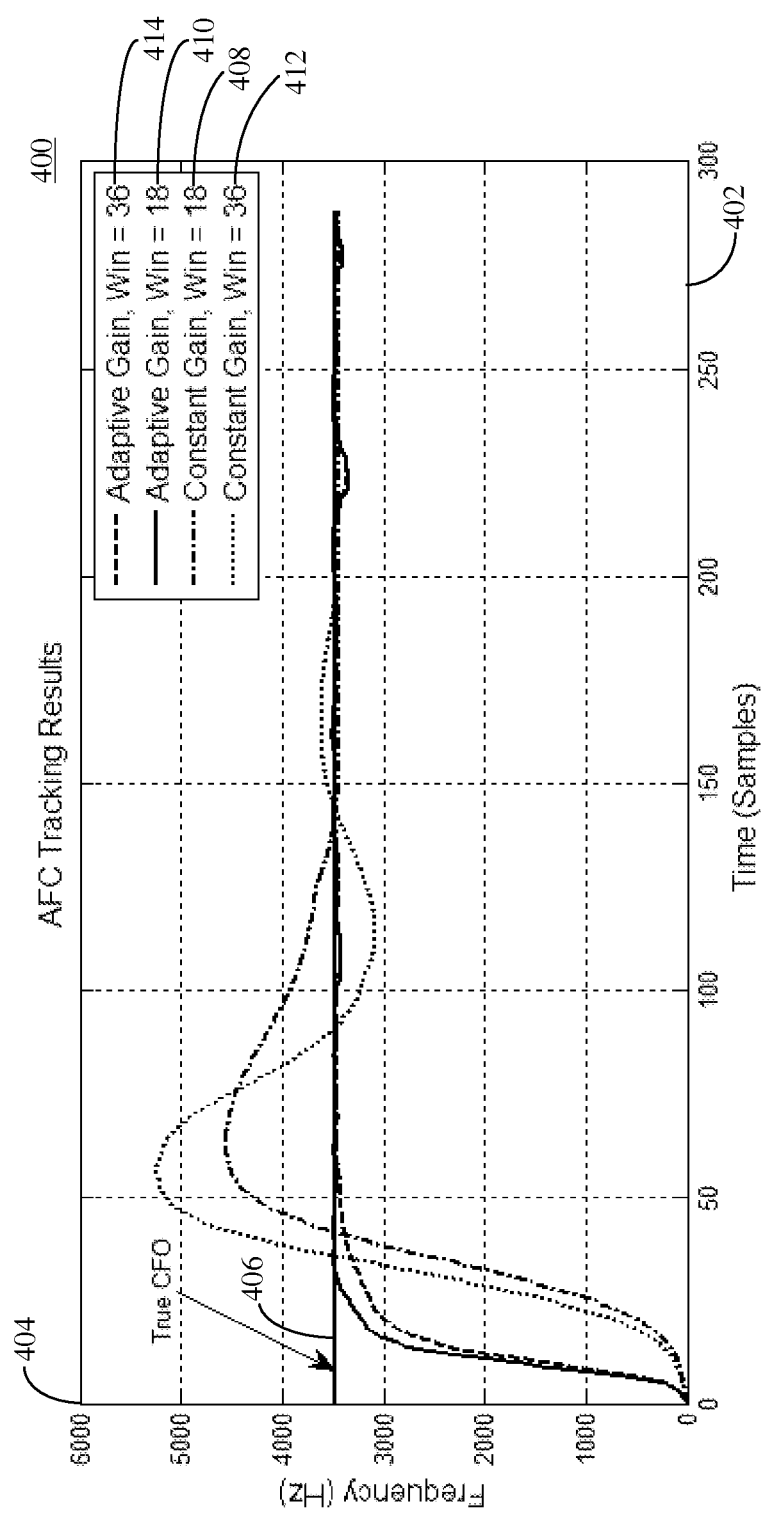
FIG. 4 depicts a graph of tracking logs of the AFC circuit of FIG. 1 at different settings in accordance with the present embodiment.

Referring to FIG. 4, a graph 400 depicts the AFC tracking results for the present embodiment of FIG. 1 with and without adaptive gain control and two different observation window length (18 and 36) are considered. The number of samples (i.e., time) is plotted along the x-axis 402 and the frequency is plotted along the y-axis 404 where the target CFO frequency is shown by the true CFO trace 406. It can be observed that the convergence speed of the system with adaptive gain control (traces 410, 414) in accordance with the present embodiment to the true CFO 406 is faster than that with constant loop gain (traces 412, 416). The graph 400 also shows the effects of the observation window length on the tracking speed. On one hand, the larger the window size 36 (traces 412, 414), the higher the estimation accuracy. On the other hand, the larger window size also slows down the tracking speed. Therefore estimation accuracy and tracking speed has to be balanced.

Figure 5:
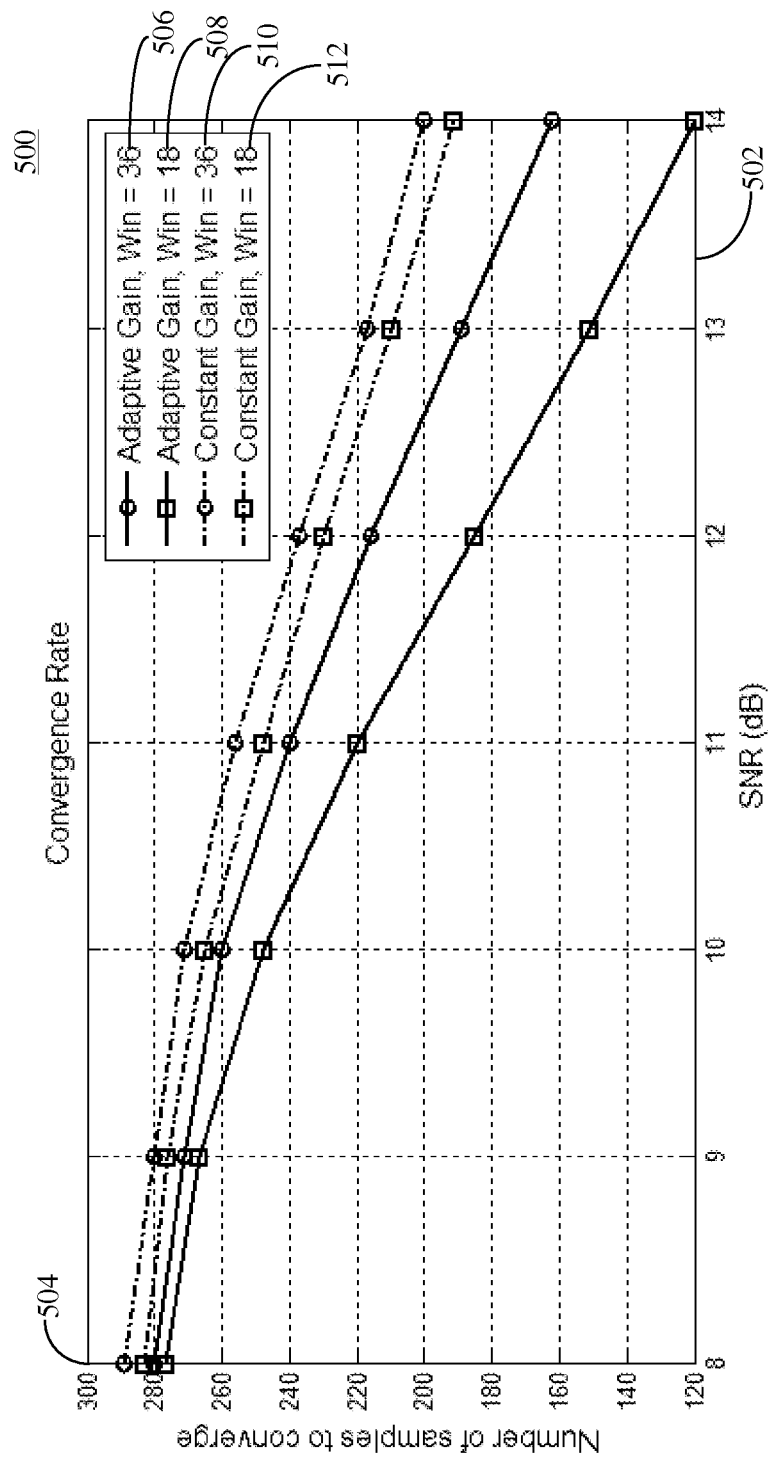
FIG. 5 depicts a graph of a comparison of convergence speeds of the AFC circuit of FIG. 1 at different settings in accordance with the present embodiment.

Referring to FIG. 5, a graph 500 depicts the convergence rate where signal-to-noise ratio (SNR) is plotted along the x-axis 502 and the number of samples needed to converge is plotted along the y-axis 504. It can be seen from the graph 500 that the adaptive gain simulations (traces 506, 508) take less samples to converge than constant gain (traces 510, 512).

Figure 6:
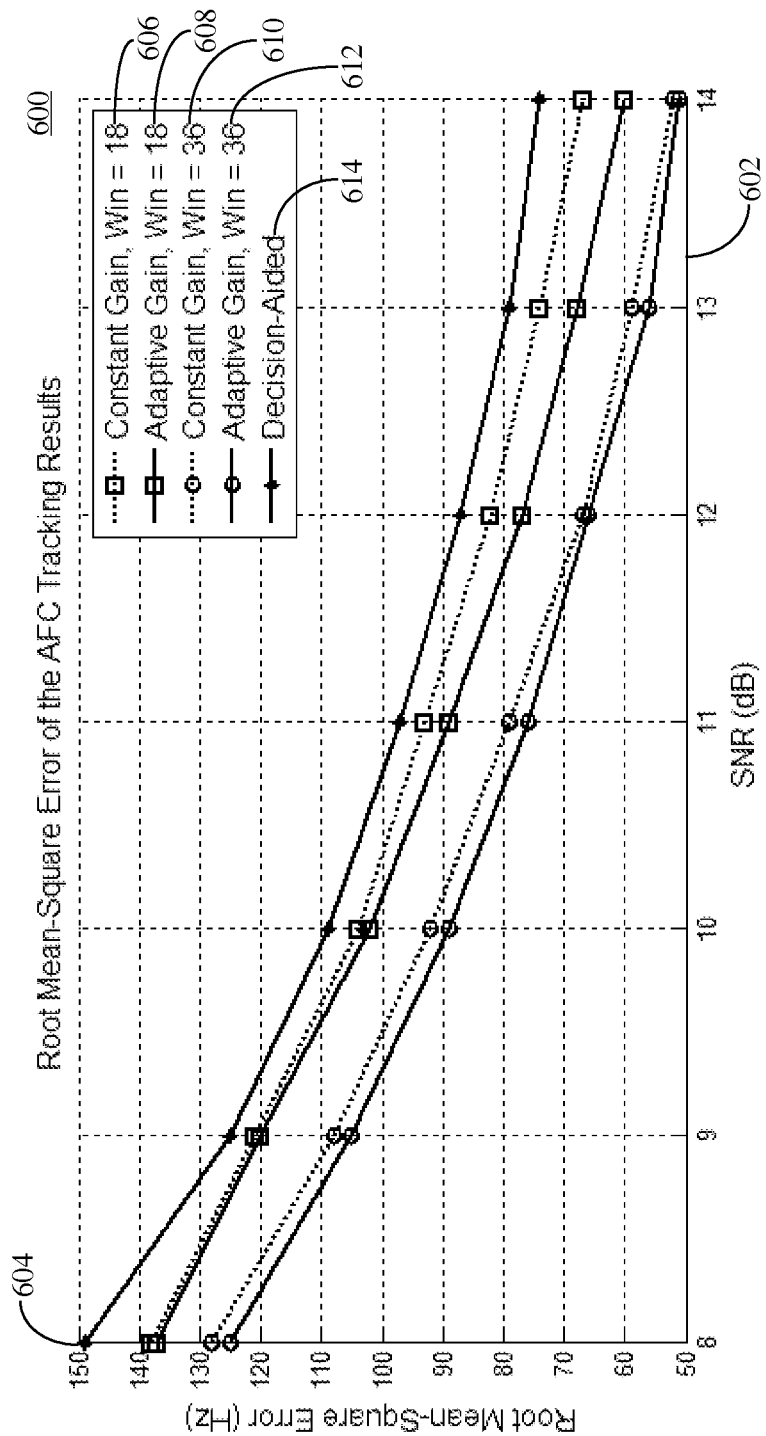
FIG. 6 depicts a graph of a comparison of root mean square errors of tracking results of the AFC circuit of FIG. 1 at different settings in accordance with the present embodiment.

Lastly, in FIG. 6, a graph 600 depicts the tracking performance of the proposed AFC with different settings where SNR is plotted along the x-axis 602 and Root Mean-Square (RMS) Error is plotted along the y-axis 604. The

TABLE 1

| Parameters | Present Embodiment | 1$^{st}$ Prior Art | 2$^{nd}$ Prior Art | 3$^{rd}$ Prior Art | 4$^{th}$ Prior Art |
| --- | --- | --- | --- | --- | --- |
| IF | 172.8 MHz | 8 MHz | 8 MHz | N.A. | 910 MHz |
| Data Rate | 1.2-4.8 MHz | 3 MHz | 3 MHz | 0.7-2.1 MHz | 1 MHz |
| Over Sampling | 9x | 8x | 8x | N.A. | 4x |
| Converge Speed | 16 bits | >32 bits | >32 bits | N.A. | N.A. |
| Mod | Multi | GFSK | GFSK | GFSK | GFSK |
| Dec-Aid | No | Yes | Yes | N.A. | No |
| Norm | Yes | No | No | Yes | No |
| Adaptive Gain | Yes | No | No | No | No |
| Trackable Δf/R$_b$ | ±4.5 | ±0.033 | ±0.033 | N.A. | ±0.24 |
| Residual Δf SNR = 10 dB | 2.4% | 3.0% | 3.5% | N.A. | 3.9% |

From the contents listed in Table 1, it can be concluded that the AFC algorithm in accordance with the present embodiment has attractive features in the areas of tracking speed, accuracy, and trackable range. The normalization scheme by reusing the existing digital RSSI and the shifting/truncating-based process to fixed point samples maintains balance between the performance and system complexity. The I Q samples are normalized to within a certain range by simple MSB searching, bit shifting and truncation. Further, the non-decision-aided CFO estimation algorithm can advantageously achieve a wider trackable range because the CFO is estimated by the moving average of the discriminator outputs and does not require timing recovery nor need to reconstruct transmitted symbols. In this manner, CFO estimation in accordance with the present embodiment has no limitation for its tracking range to be less than the maximum frequency deviation. The trackable CFO range is identified mathematically in Equation 15, above, and the advantages of this feature are proven by the contents listed in Table 1. Also, by automatically switching the adaptive loop gain between High and Low values according to the estimated CFO for each iteration, the loop gain is switched between Fast and Accurate modes, advantageously providing a higher tracking speed and better performance.

adaptive gain simulations are plotted on traces 608, 612 and the constant gain simulations are plotted on traces 606, 610. The performance of a prior art decision-aided AFC is also simulated for comparison on trace 614. In graph 600 it is shown that the proposed algorithm (traces 608, 612) achieves better performance than the decision-aided algorithm 614. This is because the performance of the decision-aided AFC 614 depends on the accuracy of timing recovery. Given the fact that there exists some random timing error, decision-aided AFC necessarily suffers some performance degradation.

Thus, in accordance with the present embodiment, an advantageous, robust moving average based AFC tracking algorithm has been presented which overcomes the drawback of the prior art. This algorithm is an easy to implement AFC scheme which does not require timing recovery and/or source data recovery and also takes into account the ICI and AGC uncertainties. The present embodiment can be applied to any CPFSK systems. The carrier frequency offset is estimated in the CFO module 116 by averaging at the block 120 the digital discriminator 114 output. An adaptive tracking loop with auto-switching loop gain is provided by the loop filter 122 to achieve higher tracking speed and accuracy. In addition, a simple normalization scheme with the assist of the existing digital RSSI 126 by shifting and truncation is provided to narrow down the required dynamic range the digital discriminator 114 and remove the effects of inter-channel interference and AGC uncertainties. The automatic loop gain control scheme is a simple comparing and switching process which is valuable to further optimize the threshold and the values of High and Low gains. While exemplary embodiments have been presented in the foregoing detailed description of the invention, it should be appreciated that a vast number of variations exist. For example, those skilled in the art will realize from the teachings herein that the present technology may also be applied to any frequency modulation scheme including FSK, GFSK, and MSK.

It should further be appreciated that the exemplary embodiments are only examples, and are not intended to limit the scope, applicability, operation, or configuration of the invention in any way. Rather, the foregoing detailed description will provide those skilled in the art with a convenient road map for implementing an exemplary embodiment of the invention, it being understood that various changes may be made in the function and arrangement of elements and method of operation described in an exemplary embodiment without departing from the scope of the invention as set forth in the appended claims.

What is claimed is:

1. A method for automatic frequency control (AFC) without bit timing recovery comprising: normalizing each sample of binary elements of a received signal to an input amplitude of the each sample by bit shifting the each sample of the binary elements or by truncating the each sample of the binary elements to enhance a dynamic range of the binary elements; and calculating a frequency discrimination for the each sample of the binary elements and a moving average of the binary elements of the received signal in an adaptive control loop until the AFC converges, wherein the adaptive control loop tracks loop gain by: utilizing multiple estimations of a carrier frequency offset (CFO) estimation, adjusting the loop gain in response to the estimated CFO, and repeating the estimating and adjusting steps until accurate correction is achieved.

2. The method in accordance with claim 1 wherein the step of calculating the moving average comprises calculating the frequency discrimination and the moving average of the binary elements of the signal without demodulating the signal.

3. An automatic frequency control (AFC) device comprising: an input module for sampling a received signal and normalizing each sample of binary elements of the received signal to an input amplitude of the each sample of the binary elements by bit shifting the each sample of the binary elements or by truncating the each sample of the binary elements to enhance a dynamic range of the binary elements; a carrier frequency offset (CFO) estimation module coupled to the input module for calculating a frequency discrimination for each of the binary elements and a moving average of the binary elements in an adaptive control loop, the CFO estimation module continuing to calculate the moving average until the AFC converges; and an adaptive loop filter coupled to the CFO estimation module for performing an adaptive tracking loop gain utilizing multiple estimations of the CFO from the CFO estimation module, wherein the adaptive loop filter has two operational modes, switches between the operational modes in response to the estimations from the CFO estimation module, and repeatedly performs the adaptive tracking the loop gain in response to an estimated CFO signal received from the CFO estimation module until accurate tracking is achieved.

4. The AFC device in accordance with claim 3 wherein the CFO estimation module receives an undemodulated received signal from the input module, the CFO estimation module calculating the moving average of the binary elements of the signal without demodulating the undemodulated received signal.

5. A method for automatic frequency control (AFC) without bit timing recovery comprising: normalizing each sample of binary elements of a received signal to an input amplitude of the each sample by bit shifting the each sample of the binary elements or by truncating the each sample of binary elements to enhance a dynamic range of the binary elements; and calculating a frequency discrimination for the each sample of the binary elements and a moving average of the binary elements of the received signal without demodulating the signal in an adaptive control loop until the AFC converges, wherein the adaptive control loop tracks loop gain by: utilizing multiple estimations of a carrier frequency offset (CFO) estimation, adjusting the loop gain in response to the estimated CFO, and repeating the estimating and adjusting steps until accurate correction is achieved.

* * * * *